(12) United States Patent
Hasegawa et al.

(10) Patent No.: US 9,295,151 B2
(45) Date of Patent: Mar. 22, 2016

(54) WIRING SUBSTRATE, MULTI-PIECE WIRING SUBSTRATE, AND METHOD FOR MANUFACTURING SAME

(75) Inventors: Masami Hasegawa, Konan (JP); Satoshi Hirayama, Ichinomiya (JP); Naoki Kito, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 136 days.

(21) Appl. No.: 14/000,568

(22) PCT Filed: Feb. 1, 2012

(86) PCT No.: PCT/JP2012/000671
§ 371 (c)(1),
(2), (4) Date: Aug. 20, 2013

(87) PCT Pub. No.: WO2012/147243
PCT Pub. Date: Nov. 1, 2012

(65) Prior Publication Data
US 2015/0107879 A1    Apr. 23, 2015

(30) Foreign Application Priority Data

Apr. 25, 2011    (JP) .................................. 2011-096829

(51) Int. Cl.
*H05K 1/03*    (2006.01)
*H05K 3/00*    (2006.01)
(Continued)

(52) U.S. Cl.
CPC .......... *H05K 1/0306* (2013.01); *C04B 41/0036* (2013.01); *H01L 23/10* (2013.01);
(Continued)

(58) Field of Classification Search
CPC ... H05K 1/0306; H05K 3/403; H05K 3/0052; H05K 1/14; H05K 2201/09045; H05K 3/0097; H05K 2201/09154; H05K 3/0029; H05K 2201/0909; H05K 2201/09036; H01L 23/13; H01L 23/10; H01L 23/49805; H01L 23/15; H01L 2924/0002; C04B 41/0036
USPC .................................................. 174/255, 262
See application file for complete search history.

(56) References Cited

U.S. PATENT DOCUMENTS 6,046,409 A * 4/2000 Ishii et al. ..................... 174/255
6,388,264 B1 * 5/2002 Pace ............................. 250/551
(Continued)

FOREIGN PATENT DOCUMENTS

CN    103120034 A    5/2013
JP    2000-068414 A    3/2000
(Continued)

OTHER PUBLICATIONS

Taiwan Intellectual Property Office, Notification for the Opinion of Examination, issued in corresponding Taiwanese application No. 101113884, mailed Oct. 23, 2014.
(Continued)

*Primary Examiner* — Hoa C Nguyen
(74) *Attorney, Agent, or Firm* — Stites & Harbison, PLLC; Jeffrey A. Haeberlin; James R. Hayne

(57) ABSTRACT

A wiring substrate includes a substrate main body which is formed of a ceramic laminate and has a rectangular shape in plan view, and which has a front surface and a back surface and has four side surfaces, each being located between the front surface and the back surface, and having a groove surface located on a side toward the front surface and a fracture surface located on a side toward the back surface; and a metalized layer which is formed on the front surface of the substrate main body so as to extend along the four side surfaces, and which has a rectangular frame shape in plan view, wherein a horizontal surface of the ceramic laminate of the substrate main body is exposed between the metalized layer and the groove surface of each side surface of the substrate main body.

5 Claims, 6 Drawing Sheets

(51) Int. Cl.
- H05K 3/40 (2006.01)
- H01L 23/13 (2006.01)
- H01L 23/10 (2006.01)
- H01L 23/498 (2006.01)
- C04B 41/00 (2006.01)
- H05K 1/14 (2006.01)
- H01L 23/15 (2006.01)

(52) U.S. Cl.
CPC ......... *H01L 23/13* (2013.01); *H01L 23/49805* (2013.01); *H05K 1/14* (2013.01); *H05K 3/0052* (2013.01); *H05K 3/403* (2013.01); *H01L 23/15* (2013.01); *H01L 2924/0002* (2013.01); *H05K 3/0029* (2013.01); *H05K 3/0097* (2013.01); *H05K 2201/017* (2013.01); *H05K 2201/0909* (2013.01); *H05K 2201/09036* (2013.01); *H05K 2201/09045* (2013.01); *H05K 2201/09154* (2013.01)

(56) References Cited

U.S. PATENT DOCUMENTS

| | | | | |
|---|---|---|---|---|
| 6,753,205 | B2 * | 6/2004 | Halahan | 438/107 |
| 6,872,436 | B2 * | 3/2005 | Suzuki et al. | 428/43 |
| 2004/0226741 | A1 * | 11/2004 | Masuko et al. | 174/255 |
| 2008/0128846 | A1 * | 6/2008 | Bui et al. | 257/437 |
| 2009/0166895 | A1 * | 7/2009 | Noguchi et al. | 257/786 |
| 2009/0294928 | A1 * | 12/2009 | Kim et al. | 257/659 |
| 2011/0170303 | A1 * | 7/2011 | Wu et al. | 362/382 |
| 2011/0315439 | A1 * | 12/2011 | Nakashima | 174/260 |
| 2013/0183475 | A1 | 7/2013 | Yoshida et al. | |

FOREIGN PATENT DOCUMENTS

| | | |
|---|---|---|
| JP | 2004-276386 A | 10/2004 |
| JP | 2005-285865 A | 10/2005 |
| JP | 2002-043701 A | 2/2008 |
| JP | 2008-186967 A | 8/2008 |
| JP | 2009-218319 A | 9/2009 |
| JP | 2010-067729 A | 3/2010 |
| JP | 2010-093544 A | 4/2010 |
| JP | 2011-009400 A | 1/2011 |

OTHER PUBLICATIONS

JPO/ISA, International Search Report issued in corresponding international application PCT/JP2012/000671, mailed Mar. 6, 2012.

Submission of Publications (identitiy of submitter omitted), received in corresponding Japanese application No. 2011-96829, Date of submission: Jul. 8, 2014.

European Patent Office, Extended European Search Report issued in corresponding European application No. 12777596.3, dated Sep. 9, 2014.

The State Intellectual Property Office of P.R. China, Notification of First Office Action, issued in corresponding Chinese application No. 201280014410, mailed Aug. 24, 2015.

* cited by examiner

WIRING SUBSTRATE, MULTI-PIECE WIRING SUBSTRATE, AND METHOD FOR MANUFACTURING SAME

TECHNICAL FIELD

The present invention relates to a wiring substrate including a substrate main body and a metalized layer provided on the front surface, etc. of the substrate main body so as to extend along side surfaces thereof, in which a plating film and a brazing material layer covering the surface of the metalized layer are not damaged; to a multi-piece wiring substrate array for simultaneously providing a plurality of the wiring substrates; and to a method for producing the multi-piece wiring substrate array.

BACKGROUND ART

Generally, ceramic wiring substrates are produced by dividing a multi-piece ceramic wiring substrate array into individual pieces along dividing grooves provided on the front surface or back surface of the wiring substrate array. In connection therewith, there has been proposed a method for producing a multi-piece wiring substrate array, in which a blade having a specific edge angle is pressed against a green sheet laminate at positions where specific dividing grooves are to be formed, so that burrs, etc. are less likely to be generated in the vicinity of the thus-formed dividing grooves during formation of individual wiring substrates from the substrate array (see, for example, Patent Document 1).

However, each of the dividing grooves formed by means of the blade has a V-shaped (acute-angled) cross section, and thus a sufficient groove width may fail to be provided between adjacent wiring substrates. Therefore, when adjacent brazing material layers for sealing are melted through heating, the brazing material layers may be accidentally fused together, and the substrate array may fail to be separated into individual wiring substrates.

In addition, since each of the dividing grooves formed by means of the blade has a V-shaped (acute-angled) cross section, when valley folding is performed the side of its front surface having the dividing grooves for separating the substrate array into individual wiring substrates, friction arises between plating films or brazing material layers (for sealing) of a pair of adjacent wiring substrate units, the films or layers being formed on metalized layers on the front surfaces of the wiring substrate units, which may cause problematic damage to the plating film or brazing material layer of each wiring substrate.

Meanwhile, there has been proposed a method for producing a ceramic substrate for division (i.e., a multi-piece ceramic wiring substrate array), in which dividing grooves having no fragile portions in the vicinity of openings thereof are provided by forming a deep and steep narrow portion at the bottom of each groove through a first laser irradiation process, and then forming a pair of chamfered portions at the opening of the narrow portion through a second laser irradiation process (see, for example, Patent Document 2).

However, the production method described in Patent Document 2 also causes problems in that plating films or brazing material layers of the wiring substrate array are damaged due to friction between the films or the layers during formation of individual wiring substrates from the substrate array, and accidental fusion between the brazing material layers cannot be reliably prevented, even when dividing grooves each having a generally Y-shaped cross section are formed through a two-step laser irradiation process, and chamfered portions are formed on both sides of the opening of each groove.

PRIOR ART DOCUMENT

Patent Document

Patent Document 1: Japanese Patent Application Laid-Open (kokai) No. 2009-218319 (pp. 1 to 11, FIGS. 1 to 8)
Patent Document 2: Japanese Patent Application Laid-Open (kokai) No. 2004-276386 (pp. 1 to 7, FIGS. 1 to 4)

SUMMARY OF THE INVENTION

Problems to be Solved by the Invention

An object of the present invention is to solve problems described in the Background Art section, and to provide a wiring substrate including a substrate main body and a metalized layer provided on the front surface, etc. of the substrate main body so as to extend along side surfaces thereof, in which a plating film and a brazing material layer covering the surface of the metalized layer are not damaged. Another object of the present invention is to provide a multi-piece wiring substrate array for simultaneously providing a plurality of the wiring substrates. Yet another object of the present invention is to provide a method for reliably producing the multi-piece wiring substrate array.

Means for Solving the Problems

In order to solve the aforementioned problems, the present invention has been achieved on the basis of the idea that each dividing groove of a ceramic multi-piece wiring substrate array is formed of a deep groove portion having an obtuse-angled cross section, and a shallow groove portion having horizontal ceramic surfaces provided on both sides of the opening of the deep groove portion.

Accordingly, the present invention provides a wiring substrate (claim 1), comprising a substrate main body which is formed of a ceramic material and has a rectangular shape in plan view, and which has a front surface and a back surface and has four side surfaces, each being located between the front surface and the back surface, and having a groove surface located on a side toward the front surface and a fracture surface located on a side toward the back surface; and a metalized layer which is formed on the front surface of the substrate main body so as to extend along the four side surfaces, and which has a rectangular frame shape in plan view, the wiring substrate being characterized in that a horizontal surface where the ceramic material of the substrate main body is exposed is located between the metalized layer and the groove surface of each side surface of the substrate main body.

Examples of the aforementioned ceramic material include high-temperature fired ceramic materials such as alumina, and low-temperature fired ceramic materials such as glass-ceramic materials.

The substrate main body of the aforementioned wiring substrate, or the substrate main body of the below-described multi-piece wiring substrate array is formed by stacking a plurality of ceramic layers together.

The groove surface, which is provided between the vertically extending fracture surface and the horizontal surface, is inclined by more than 45° (half the obtuse angle) or about 45° with respect to the vertical line.

The metalized layer is a conductor layer containing, for example, W, Mo, Cu, or Ag as a main component, and the front surface of the conductor layer is covered with, for example, an Ni plating film or an Au plating film.

The aforementioned brazing material layer is formed of, for example, an Ag—Cu alloy or an Au—Sn alloy. The brazing material layer is employed for mounting a lid plate or metal fittings on the metalized layer, and is provided on the aforementioned plating film covering the metalized layer.

The horizontal surface (i.e., the exposed surface of the ceramic substrate main body) is a relatively flat surface which is generally parallel to the top and back surfaces of the substrate main body.

In addition, a cavity is provided on the front surface of the substrate main body. The cavity is located inside of the metalized layer, and is open on the side toward the front surface. An electronic component (e.g., a crystal oscillator) is to be mounted on the bottom of the cavity.

The present invention also encompasses a wiring substrate (claim 2) wherein a groove surface similar to the front-surface-side groove surface is provided between the back surface of the substrate main body and the fracture surface of each side surface; a metalized layer similar to that described above is formed on the back surface of the substrate main body so as to extend along the four side surfaces; and another horizontal surface where the ceramic material of the substrate main body is provided between the metalized layer on the back surface and the back-surface side groove surface of each side surface of the substrate main body.

The present invention also encompasses a wiring substrate (claim 3) wherein a notch is formed on a side surface of the substrate main body so as to extend from the front surface of the substrate main body to the back surface thereof in a thickness direction, the notch being open on the side toward the fracture surface of the side surface, and a conductor layer is formed on an inner wall of the notch such that at least one of the upper end and the lower end of the conductor layer does not extend to the horizontal surface.

The notch formed on a side surface of the wiring substrate and the conductor layer formed on the inner wall of the notch are located at a middle portion (in a horizontal direction) of the side surface, or at the corner formed by a pair of adjacent side surfaces. The conductor layer has a semicircular or quarter-arc-shaped cross section in plan view.

The present invention also provides a multi-piece wiring substrate array (claim 4), comprising a product region having a plurality of wiring substrate units which are adjacently arranged in a matrix form, each unit including a substrate main body which is formed of a ceramic material, and which has a front surface and a back surface and has a rectangular shape in plan view, and a rectangular-frame-shaped metalized layer provided on at least one of the front surface and the back surface of the substrate main body; an edge portion which is formed of the ceramic material, which is located around the product region, and which has a front surface and a back surface and has a rectangular frame shape in plan view; and dividing grooves which are formed on at least one of the front surface and the back surface of the wiring substrate array and are arranged in a lattice shape in plan view, and which are provided between adjacent wiring substrate units and between the product region and the edge portion, the multi-piece wiring substrate array being characterized in that each of the dividing grooves is formed of a deep groove portion provided between adjacent wiring substrate units, and a shallow groove portion defined by a pair of adjacent metalized layers formed on at least the front surfaces or the back surfaces of the adjacent wiring substrate units, and by a pair of adjacent horizontal surfaces of the adjacent ceramic substrate main bodies, each horizontal surface being exposed between the metalized layer and the deep groove portion.

The deep groove portion of each dividing groove preferably has an obtuse-angled (more than 90°) cross section. However, the cross-sectional angle of the deep groove portion may be 90° or less than 90° (about 80° or more).

The present invention also encompasses a multi-piece wiring substrate array (claim 5) wherein each of the dividing grooves has a through-hole which extends from the front surface to the back surface and which crosses with the dividing groove in a radial direction of the through-hole, and a tubular conductor formed on the inner wall of the through-hole.

The present invention also provides a method for producing a multi-piece wiring substrate array (claim 6), the multi-piece wiring substrate array comprising a product region having a plurality of wiring substrate units which are adjacently arranged in a matrix form, each unit including a substrate main body which is formed of a ceramic material, and which has a front surface and a back surface and has a rectangular shape in plan view, and a frame-shaped metalized layer provided on at least one of the front surface and the back surface of the substrate main body; an edge portion which is formed of the ceramic material, which is located around the product region, and which has a front surface and a back surface and has a rectangular frame shape in plan view; and dividing grooves which are formed on at least one of the front surface and the back surface of the substrate array and are arranged in a lattice shape in plan view, and which are provided between adjacent wiring substrate units and between the product region and the edge portion, characterized in that the method comprises a step of providing a green sheet which has a front surface and a back surface and which is to become a multi-piece wiring substrate array having a product region and an edge portion, and forming a frame-shaped metalized layer on at least one of the front surface and the back surface of a portion of the green sheet corresponding to the product region; and a step of forming a dividing groove in the green sheet by irradiating at least one of the front surface and the back surface of the green sheet with a laser beam so that the laser beam is scanned on the metalized layer along a portion which is to become a dividing groove, the dividing groove having a deep groove portion, and a shallow groove portion defined by a pair of adjacent horizontal surfaces of the green sheet which are exposed at the opposite sides of the deep groove portion, and by a pair of adjacent metalized layers provided externally of the horizontal surfaces.

The green sheet is a laminate of a plurality of green sheets.

The metalized layer is formed of an electrically conductive paste containing, for example, W, Mo, Cu, or Ag as a main component. After firing of the paste, the surface of the resultant layer is coated with an electrolytic plating film (e.g., Ni plating film or Au plating film), and a preformed brazing material is provided on the plating film.

The present invention also encompasses a method for producing a multi-piece wiring substrate array (claim 7), wherein, in the dividing groove formation step, the surface of the green sheet is irradiated with the laser beam by two or more processes so that the laser beam is scanned along the portion which is to become a dividing groove; in the first process, the focal point of the laser beam is set to a position in the vicinity of the surface of the metalized layer; and in the second or subsequent process, the focal point of the laser beam is set to a position deeper or shallower, in a thickness direction of the green sheet, than the position of the focal point of the laser beam in the first process.

Effects of the Invention

According to the wiring substrate of claim 1, a horizontal surface of the ceramic substrate main body is located between a metalized layer formed so as to extend along side surfaces of the substrate main body and a groove surface (i.e., one of the inner wall surfaces of a dividing groove) and a surface formed on each side surface by dividing the below-described multi-piece wiring substrate array into individual wiring substrates. In addition, the groove surface is greatly inclined (inclined by more than 45° or about 45°) with respect to the vertical line. Therefore, brazing material layers provided on the metalized layers of adjacent wiring substrates are not fused with each other, and thus neither removal of the brazing material layers nor formation of burrs occurs during formation of individual wiring substrates. In addition, even when valley folding is performed on the side toward its front surface for dividing the substrate array into individual wiring substrates, friction does not arise between the plating films (e.g., Ni or Au plating films) or brazing material layers covering the surfaces of the metalized layers of adjacent wiring substrates, resulting in no damage to the plating films or the brazing material layers. Furthermore, seal rings bonded, via the brazing material layers, to the wiring substrates are less likely to be deformed, which would otherwise occur due to mutual contact between metal fittings (the seal rings). Therefore, a cavity which is open on the side toward the front surface of the substrate main body can be sealed by reliably bonding a metallic lid plate or metal fittings to the cavity.

According to the wiring substrate of claim 2, similar to the case of the front surface of the substrate main body, a metalized layer is formed on the back surface and around a cavity which is open on the side toward the back surface. In addition, a horizontal surface is located between the metalized layer formed on each of the front surface and the back surface and each of the groove surfaces provided on the front surface side and the back surface side, the groove surfaces sandwiching the fracture surface located at a middle portion (in a thickness direction) of each side surface of the substrate main body. Therefore, a plurality of cavities which are open on both the front surface side and the back surface side of the substrate main body can be sealed by reliably bonding metallic lid plates or metal fittings to the cavities.

According to the wiring substrate of claim 3, even when the conductor layer which is formed on the inner wall of the notch and which is employed for electrical conduction to the outside reaches the innermost portion (in plan view) of the groove surface, since a horizontal surface of the ceramic substrate main body is exposed between the conductor layer and the aforementioned metalized layer, accidental short circuit can be prevented between the conductor layer and the plating film or brazing material layer covering the surface of the metalized layer. Therefore, operation of an electronic component to be mounted or internal wiring can be reliably secured.

According to the multi-piece wiring substrate array of claim 4, each of the dividing grooves provided between adjacent wiring substrate units and between the product region and the edge portion is formed of a deep groove portion having a wide opening, and a shallow groove portion having a pair of horizontal surfaces located between the deep groove portion and a pair of adjacent metalized layers. Therefore, even when the multi-piece wiring substrate array is subjected to valley folding along the dividing grooves on the side toward its front surface or back surface for dividing the multi-piece wiring substrate array into individual wiring substrates, there can be reliably prevented damage to the plating films or brazing material layers covering the surfaces of the metalized layers of adjacent wiring substrates, which would otherwise occur due to mutual friction between the plating films or the brazing material layers. In addition, even when adjacent brazing material layers are melted through heating, accidental fusion between the brazing material layers can be reliably prevented. Thus, there can be reliably provided a plurality of wiring substrates, in which a cavity which is open on at least one of the front surface side and the back surface side of the substrate main body can be sealed by reliably bonding a metallic lid plate or metal fittings to the cavity.

When the multi-piece wiring substrate array of claim 5 is divided, along the dividing grooves, into a plurality of individual wiring substrates, each of the wiring substrates has a notch which is located at a middle portion (in a horizontal direction) of a side surface or at the corner formed by a pair of adjacent side surfaces, and which is formed through division of the aforementioned through-hole in an axial direction so as to extend from the front surface of the wiring substrate to the back surface thereof in a thickness direction; and a conductor layer which is formed on the inner wall of the notch through division of the aforementioned tubular conductor in an axial direction. In addition, accidental short circuit between the conductor layer and the aforementioned metalized layer can be prevented in the vicinity of a side surface of each wiring substrate.

When a multi-piece wiring substrate array produced through the multi-piece wiring substrate array production method of claim 6 is divided into individual wiring substrates, friction does not arise between the plating films or brazing material layers covering the surfaces of the metalized layers of adjacent wiring substrates, resulting in no damage to the plating films or the brazing material layers. In addition, the multi-piece wiring substrate array production method can reliably produce a multi-piece wiring substrate array including a plurality of wiring substrate units, in which accidental fusion between adjacent brazing material layers does not occur, and there is prevented deformation of seal rings bonded via the brazing material layers to the wiring substrate units, which would otherwise occur due to mutual contact between the seal rings.

Furthermore, according to the multi-piece wiring substrate array production method of claim 7, a deep groove portion having an acute-angled cross section and a narrow-width opening is formed through the first laser irradiation process, and then the metalized layer, which is offset from the focal point of the laser beam, is preferentially removed and the cross-sectional angle of the deep groove portion is increased through the second laser irradiation process. Thus, there can be reliably formed, at a specific position of the green sheet, lattice-shaped dividing grooves each having the deep groove portion, and a shallow groove portion which has a pair of horizontal surfaces located between the deep groove portion and a pair of adjacent metalized layers.

MODES FOR CARRYING OUT THE INVENTION

Embodiments of the present invention will next be described.

Figure 1:
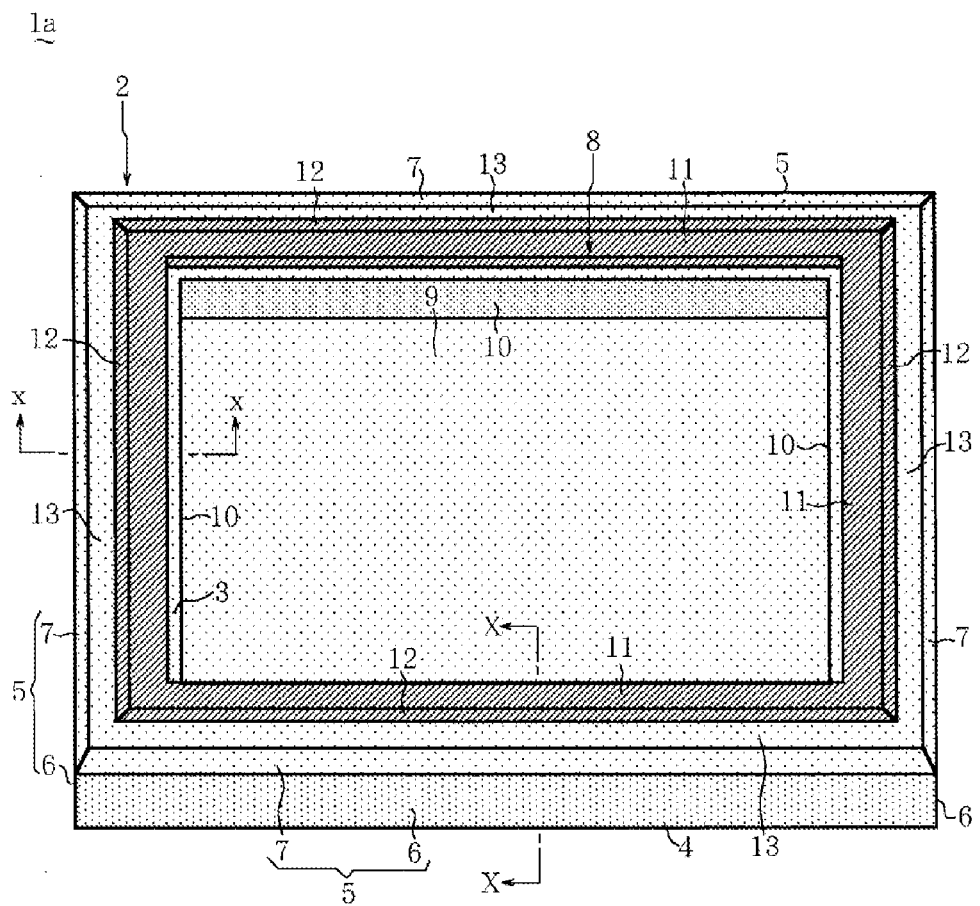
FIG. 1 is a perspective view of a wiring substrate according to one embodiment of the present invention.
Figure 2:
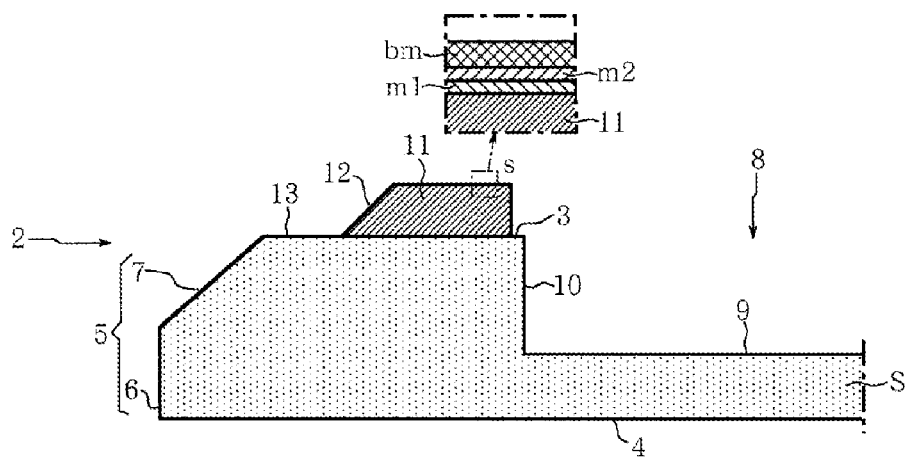
FIG. 2 is a partial, vertical cross-sectional view of the wiring substrate of FIG. 1 taken along line X-X or line x-x.

FIG. 1 is a perspective view of a wiring substrate 1a according to one embodiment of the present invention; and FIG. 2 is a partial, vertical cross-sectional view of the wiring substrate of FIG. 1 taken along line X-X or line x-x.

As shown in FIGS. 1 and 2, the wiring substrate 1a includes a substrate main body 2 formed of a plurality of ceramic (e.g., alumina) layers (ceramic laminate) S and having a rectangular shape in plan view; and a metalized layer 11 having a rectangular frame shape in plan view. The substrate main body 2 has a front surface 3 and a back surface 4, and four side surfaces 5, each being located between the front surface 3 and the back surface 4, and having an inclined groove surface 7 located on the side toward the front surface 3 and a fracture surface 6 of the ceramic laminate S located on the side toward the back surface 4. The metalized layer 11 is formed on the front surface 3 of the substrate main body 2 so as to extend along the four side surfaces 5.

A rectangular parallelepiped cavity 8 is open on the side toward the front surface 3 of the substrate main body 2, and the cavity 8 is defined by a back surface 9 having a rectangular shape in plan view, and sidewalls 10 standing on the four edges of the back surface 9. A non-illustrated electronic component (e.g., a crystal oscillator) can be mounted in the cavity 8 by electrically connecting the electrode of the electronic component to a non-illustrated electrode provided on the back surface 9 through, for example, brazing.

The aforementioned ceramic layers (ceramic laminate) S may be formed of a high-temperature fired ceramic material other than alumina, or may be formed of a low-temperature fired ceramic material such as glass-ceramic.

In each of the aforementioned side surfaces 5, the groove surface 7 located on the side toward the front surface 3 is formed through the below-described laser processing. The groove surface 7 is smoother than the fracture surface 6 (i.e., exposed surface of the ceramic laminate S) located on the side toward the back surface 4, and is inclined by more than 45° with respect to the vertical line.

When the ceramic laminate S is formed of a high-temperature fired ceramic material such as alumina, the metalized layer 11 is formed of, for example, W or Mo, whereas when the ceramic laminate S is formed of a low-temperature fired ceramic material such as glass-ceramic, the metalized layer 11 is formed of, for example, Cu or Ag. As shown in FIG. 2, the metalized layer 11 has a generally rectangular cross section, and has an inclined surface 12 on the side toward the side surface 5. As shown in the partially enlarged cross-sectional view of a portion s surrounded by a dashed-dotted line in FIG. 2, for example, an Ni plating film m1 and an Au plating film m2 (plating films) and a brazing material layer bm (e.g., an Ag—Cu alloy layer or an Au—Sn alloy layer) are sequentially formed on the front surface of the metalized layer 11.

A horizontal surface 13 (having a constant width) of the ceramic laminate S is exposed between the inclined surface 12 of the metalized layer 11 and the groove surface 7 of the side surface 5 so as to be located along the four sides of the substrate main body 2.

In the aforementioned wiring substrate 1a, the horizontal surface 13 of the ceramic laminate S of the substrate main body 2 is exposed between the metalized layer 11 and the groove surface 7 of each side surface 5 of the substrate main body 2. Therefore, even when the brazing material layers bm (for sealing) of the below-described multi-piece wiring substrate array are melted through heating, adjacent brazing material layers bm are not fused (bridged) with each other, and thus neither removal of the brazing material layers nor formation of burrs occurs during formation of individual wiring substrates. In addition, even when the multi-piece wiring substrate array is subjected to valley folding on the side toward its front surface 3 for separating the substrate array into individual wiring substrates 1a, friction does not arise between the Ni plating films m1 or Au plating films m2 or the brazing material layers bm covering the surfaces of the metalized layers 11 of adjacent wiring substrates 1a, resulting in no damage to the plating films or the brazing material layers. Therefore, the cavity 8, which is open on the side toward the front surface 3 of the substrate main body 2, can be sealed by reliably bonding a metallic lid plate or metal fittings to the cavity 8 by means of the aforementioned brazing material layer bm.

The front surface 3 or back surface 4 of the wiring substrate 1a, or the back surface 9 of the cavity 8 may have a square shape in plan view.

Figure 3:
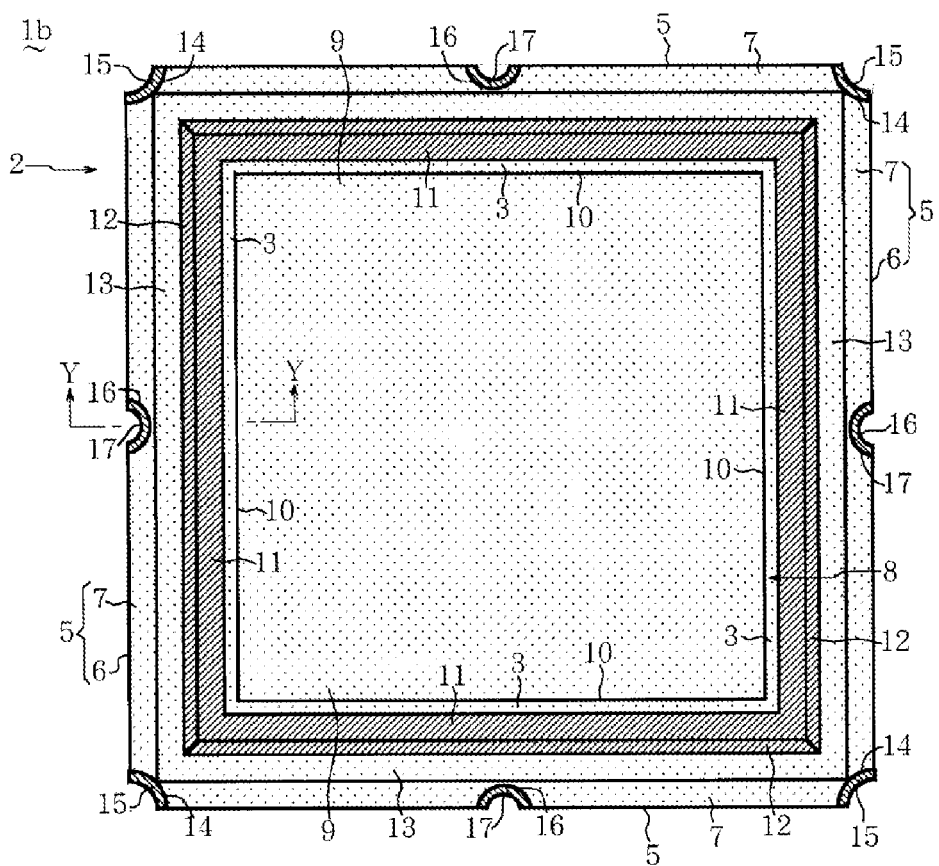
FIG. 3 is a plan view of a wiring substrate, which is an applied embodiment of the aforementioned wiring substrate.
Figure 4:
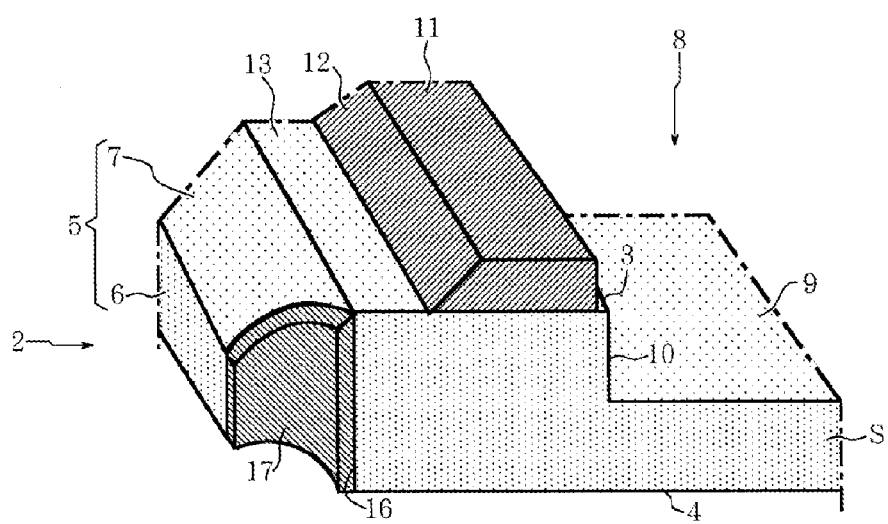
FIG. 4 is a partial perspective view of the wiring substrate of FIG. 3 including a vertical cross section taken along line Y-Y.

FIG. 3 is a plan view of a wiring substrate 1b, which is an applied embodiment of the wiring substrate 1a; and FIG. 4 is a partial perspective view of the wiring substrate of FIG. 3 including a vertical cross section taken along line Y-Y of FIG. 3.

As shown in FIGS. 3 and 4, the wiring substrate 1b includes a substrate main body 2 formed of a ceramic laminate S similar to that described above, and having a square (rectangular) shape in plan view; and a metalized layer 11 having a square (rectangular) frame shape in plan view. The substrate main body 2 has a front surface 3 and a back surface 4, and four side surfaces 5, each being located between the front surface 3 and the back surface 4, and having an inclined groove surface 7 located on the side toward the front surface 3 and a fracture surface 6 of the ceramic laminate S located on the side toward the back surface 4. The metalized layer 11 is formed on the front surface 3 of the substrate main body 2 so as to extend along the four side surfaces 5. A cavity 8 similar to that described above and having a square shape in plan view is open on the side toward the front surface 3 of the substrate main body 2.

As shown in FIGS. 3 and 4, also in the case of the wiring substrate 1*b*, a horizontal surface 13 (having a constant width) of the ceramic laminate S is exposed between the groove surface 7 of each of the side surfaces 5 and the inclined surface 12 of the metalized layer 11 so as to be located along the four sides of the substrate main body 2.

A notch 14 is provided at the corner formed by a pair of adjacent side surfaces 5, 5 of the substrate main body 2. The notch 14, which has a quarter-arc-shaped cross section, extends from the front surface 3 of the substrate main body to the back surface 4 thereof in a thickness direction. A conductor layer 15 having an arc-shaped cross section similar to that described above is formed on the curved inner wall of the notch 14 which is open on the side toward the fracture surface 6.

In addition, a notch 16 is provided at a middle portion (in a horizontal direction) of each side surface 5. The notch 16, which has a semicircular cross section, extends from the front surface 3 of the substrate main body to the back surface 4 thereof in a thickness direction. A conductor layer 17 is formed on the semicircular tubular inner wall of the notch 16 which is open on the side toward the fracture surface 6. As shown in FIGS. 3 and 4, the upper end of each of the conductor layers 15 and 17 does not extend to the horizontal surface 13 adjacent thereto.

Similar to the aforementioned case, each of the conductor layers 15 and 17 is formed of, for example, W or Mo, and is bonded through brazing to an external terminal of a printed board (not illustrated), etc. including the wiring substrate 1*b*. Each of the conductor layers 15 and 17 is employed for electrical conduction to internal wiring or an electronic component (not illustrated) to be mounted in the cavity 8.

The wiring substrate 1*b*, which has the aforementioned configuration, exhibits effects similar to those obtained by the wiring substrate 1*a*. Furthermore, in the wiring substrate 1*b*, since the horizontal surface 13 of the ceramic laminate S is exposed between of the conductor layer 15 or 17 and the metalized layer 11, accidental short circuit can be prevented between the conductor layer 15 or 17 and the plating film m1 or m2 or brazing material layer bm covering the surface of the metalized layer 11. Therefore, operation of an electronic component to be mounted or internal wiring can be reliably secured.

The front surface 3 or back surface 4 of the wiring substrate 1*b*, or the back surface 9 of the cavity 8 may have a rectangular shape in plan view.

Figure 5:
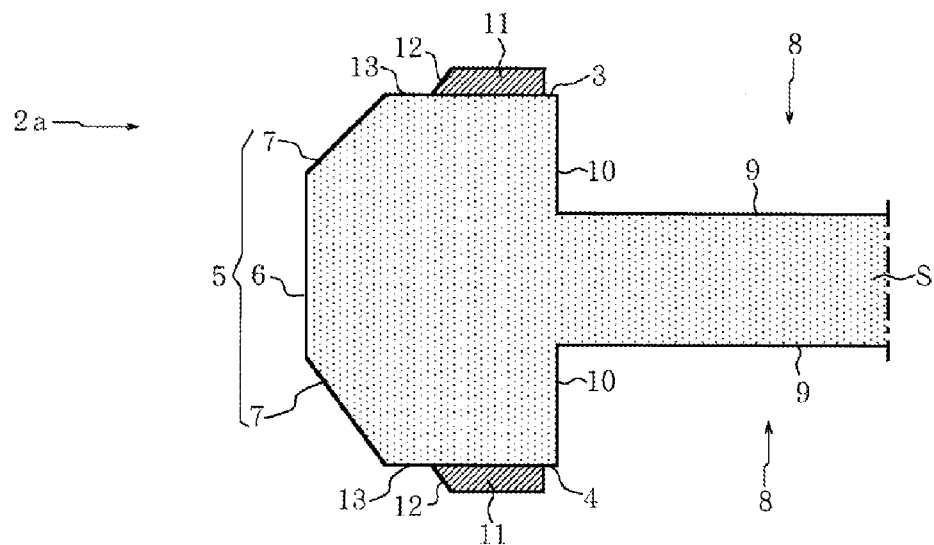
FIG. 5 is a partial, vertical cross-sectional view (similar to FIG. 2) of a wiring substrate, which is another applied embodiment of the wiring substrate of FIG. 1.

FIG. 5 is a partial, vertical cross-sectional view (similar to FIG. 2) of a wiring substrate 1*c*, which is another applied embodiment of the wiring substrate 1*a*. Similar to the aforementioned case, the wiring substrate 1*c* includes a substrate main body 2*a* having a front surface 3, a back surface 4, and side surfaces 5, and a metalized layer 11 formed on the side toward the front surface 3. In addition, as shown in FIG. 5, a groove surface 7, a horizontal surface 13, and a metalized layer 11 are provided between the back surface 4 and the fracture surface 6 of each side surface 5 so as to be in line symmetry with respect to those provided on the side toward the front surface 3. That is, in each side surface 5 of the wiring substrate 1*c*, a pair of groove surfaces 7 are symmetric with each other with respect to the fracture surface 6 located at a middle portion (in a thickness direction) of the side surface 5. A cavity 8 provided inside of the metalized layer 11 on the back surface 4, which is open on the side toward the back surface 4, is in symmetry to the aforementioned cavity 8 on the side toward the front surface.

In the case of the wiring substrate 1*c*, even when the brazing material layers bm provided on wiring substrate units of the below-described multi-piece wiring substrate array are melted through heating, adjacent brazing material layers bm are not accidentally fused with each other, and thus neither removal of the brazing material layers nor formation of burrs occurs during formation of individual wiring substrates. In addition, even when the multi-piece wiring substrate array is subjected to valley folding on the side toward its back surface 4 for separating the substrate array into individual wiring substrates, friction does not arise between the Ni plating films m1 or Au plating films m2 or the brazing material layers bm covering the surfaces of the metalized layers 11 of adjacent wiring substrates 1*c*, resulting in no damage to the plating films or the brazing material layers. Therefore, each of the cavities 8 which are open on both sides of the front surface 3 and the back surface 4 can be reliably sealed.

Figure 6:
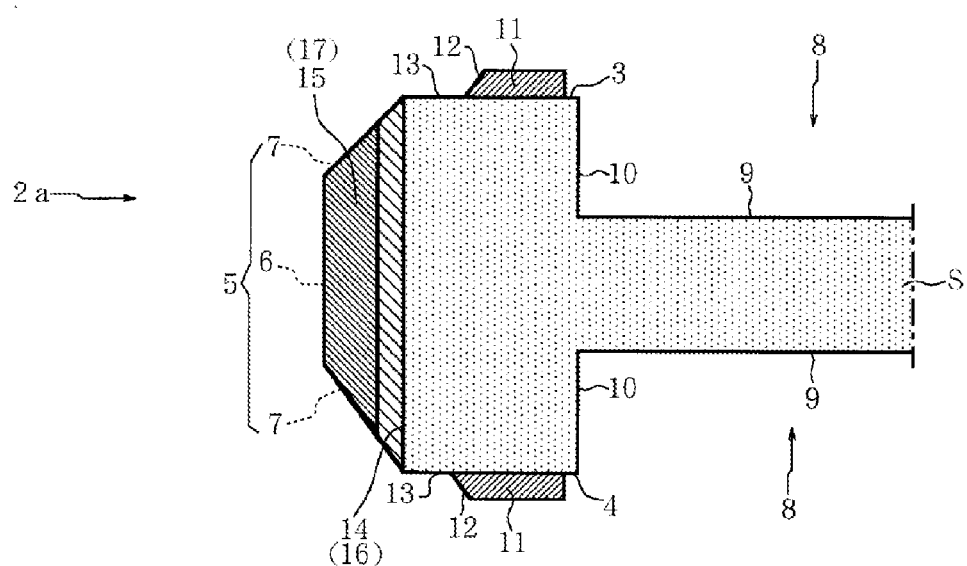
FIG. 6 is a partial, vertical cross-sectional view (similar to FIG. 2) of a wiring substrate, which is an applied embodiment of the wiring substrate of FIG. 3.

FIG. 6 is a partial, vertical cross-sectional view (similar to FIG. 2) of a wiring substrate 1*d*, which is an applied embodiment of the wiring substrate 1*b*. Similar to the aforementioned case, the wiring substrate 1*d* includes a substrate main body 2*a*, a metalized layer 11 formed on the front surface 3 of the substrate main body 2*a*, and a cavity 8 provided on the side toward the front surface 3. In addition, as shown in FIG. 6, a groove surface 7 of each side surface 5, a horizontal surface 13, a metalized layer 11, and a cavity 8 are also provided on the side toward the back surface 4 of the substrate main body 2*a* so as to be in symmetry with respect to those provided on the side toward the front surface 3.

As shown in FIG. 6, similar to the aforementioned case, a notch 14 (16) extending from the front surface 3 to the back surface 4 in a thickness direction is provided between a pair of groove surfaces 7, 7 of each side surface 5, and a conductor layer 15 (17) is formed on the inner wall of the notch 14 or 16 in a manner similar to that described above. Neither the upper end nor the lower end of the conductor layer 15 (17) extends to the horizontal surfaces 13 on the sides of the front surface 3 and the back surface 4.

In the wiring substrate 1*d*, accidental short circuit can be prevented between the conductor layer 15 or 17 and the plating film m1 or m2 or brazing material layer bm covering the surface of the metalized layer 11 provided on each of the front surface 3 and the back surface 4. Therefore, there can be reliably secured internal wiring and operation of an electronic component to be mounted in each of the cavities 8 which are open on the sides of the front surface 3 and the back surface 4.

Figure 7:
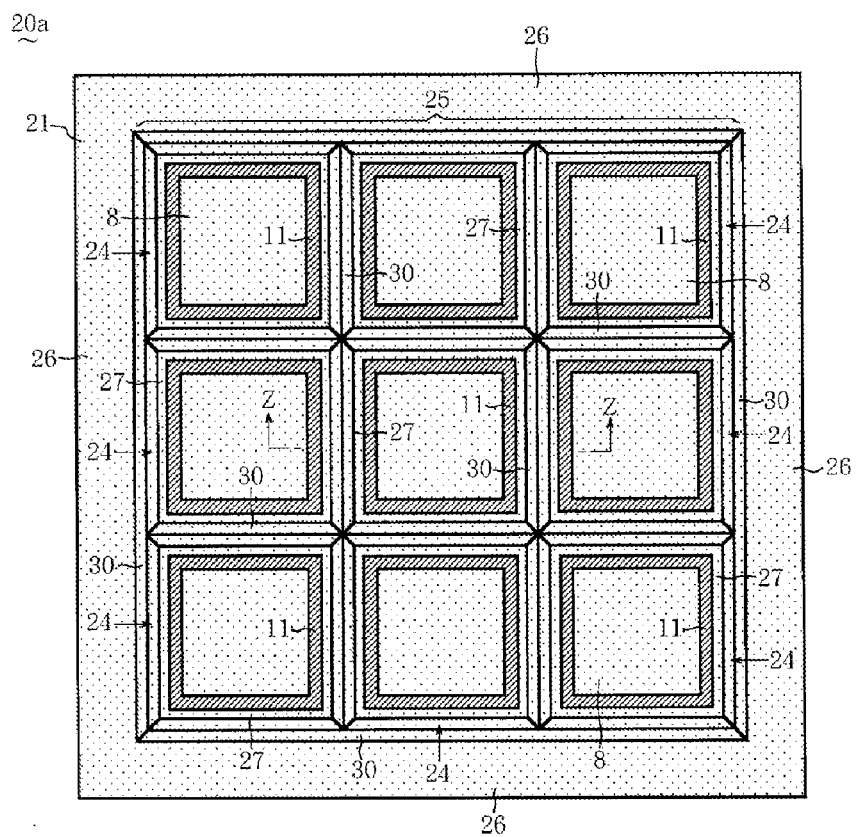
FIG. 7 is a plan view of a multi-piece wiring substrate array according to one embodiment of the present invention.
Figure 8:
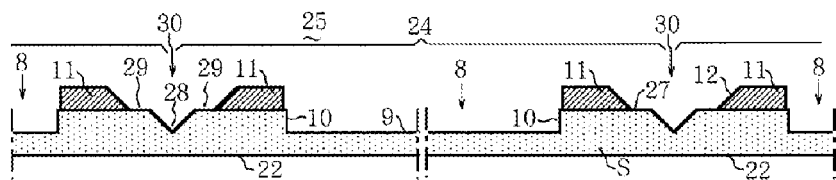
FIG. 8 is a partial, vertical cross-sectional view of the multi-piece wiring substrate array of FIG. 7 taken along line Z-Z.

FIG. 7 is a plan view of a multi-piece wiring substrate array 20*a* for producing a plurality of wiring substrates 1*a*; FIG. 8 is a partial, vertical cross-sectional view of the wiring substrate array of FIG. 7 taken along line Z-Z; and FIG. 9 is an enlarged view of a portion in the vicinity of a dividing groove shown in FIG. 8.

Figure 9:
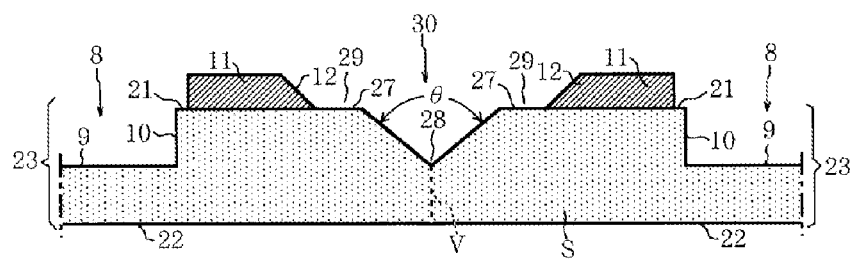
FIG. 9 is an enlarged view of a portion in the vicinity of a dividing groove shown in FIG. 8.

As shown in FIGS. 7 to 9, the multi-piece wiring substrate array 20*a* includes a product region 25 having a front surface 21 and a back surface 22, and having a plurality of wiring substrate units 24 which are adjacently arranged in a matrix form in plan view; an edge portion 26 which is located around the product region 25, and which has the front surface 21 and the back surface 22 and has a square (rectangular) frame shape in plan view; and dividing grooves 30 which are formed on the front surface 21 and are arranged in a lattice shape in plan view, and which are provided between the wiring substrate units 24, 24 and between the product region 25 and the edge portion 26.

Each of the product region 25 and the edge portion 26 is formed of a ceramic laminate S similar to that described above. In FIGS. 7 to 9 and FIG. 10 and subsequent figures, the front surface 21 and the back surface 22 are common in a substrate main body 23, the product region 25, and the edge portion 26.

As shown in FIGS. 7 to 9, each of the wiring substrate units 24 includes the substrate main body 23 which has the front surface 21 and the back surface 22 and has a square (rectangular) shape in plan view; a rectangular-frame-shaped metalized layer 11 provided on the front surface 21 of the substrate main body 23; and a cavity 8 similar to that described above, which is provided inside of the metalized layer 11 and is open on the side toward the front surface 21.

Plating films m1 and m2 and a brazing material layer bm, which are similar to those described above, are formed on the front surface of the metalized layer 11, the surface being exposed to the outside.

As shown in FIG. 9, each dividing groove 30 has a deep groove portion 28 which has a cross-sectional obtuse angle θ and whose bottom is located at a position where the dividing groove is to be formed (hereinafter the position may be referred to as a "dividing groove-forming position") V, the dividing groove-forming position being located between adjacent wiring substrate units 24, 24, and a shallow groove portion 29 defined by the inclined surfaces 12 of the metalized layers 11 formed on the front surfaces 21 of a pair of the adjacent wiring substrate units 24, and by a pair of adjacent horizontal surfaces 27 of the ceramic laminate S, each horizontal surface being exposed between the metalized layer 11 and the deep groove portion 28. The deep groove portion 28 has a generally isosceles triangular cross section whose bottom has an obtuse angle θ of 90° or more to about 150°, and the shallow groove portion 29 has a generally inverted-trapezoidal cross section.

In the aforementioned multi-piece wiring substrate array 20a, each dividing groove 30 is formed of the deep groove portion 28 and the shallow groove portion 29. Therefore, even when the brazing material layers bm formed on the metalized layers 11 of adjacent wiring substrate units 24 are melted through heating, accidental fusion between the adjacent brazing material layers bm can be reliably prevented. In addition, even when the multi-piece wiring substrate array is subjected to valley folding along the dividing grooves 30 on the side toward its front surface 21 (i.e., on the side on which the grooves 30 are open) for dividing the substrate array into individual wiring substrate units 24, there can be reliably prevented damage to the plating films m1 or m2 or brazing material layers bm covering the surfaces of the metalized layers 11 of adjacent wiring substrate units 24, which would otherwise occur due to mutual friction between the plating films or the brazing material layers. Thus, there can be reliably provided a plurality of wiring substrates 1a, in which the cavity 8 which is open on the side toward the front surface 3 of the substrate main body 2 can be sealed by reliably bonding and fixing a metallic cover plate or a seal ring to the cavity 8.

When a cavity 8, a metalized layer 11, and dividing grooves 30 are provided on the side toward the back surface 22 of each wiring substrate unit 24 of the product region 25 so as to be in line symmetry with respect to those provided on the side toward the front surface 21, there can be provided a multi-piece wiring substrate array for producing a plurality of the aforementioned wiring substrates 1c.

Figure 10:
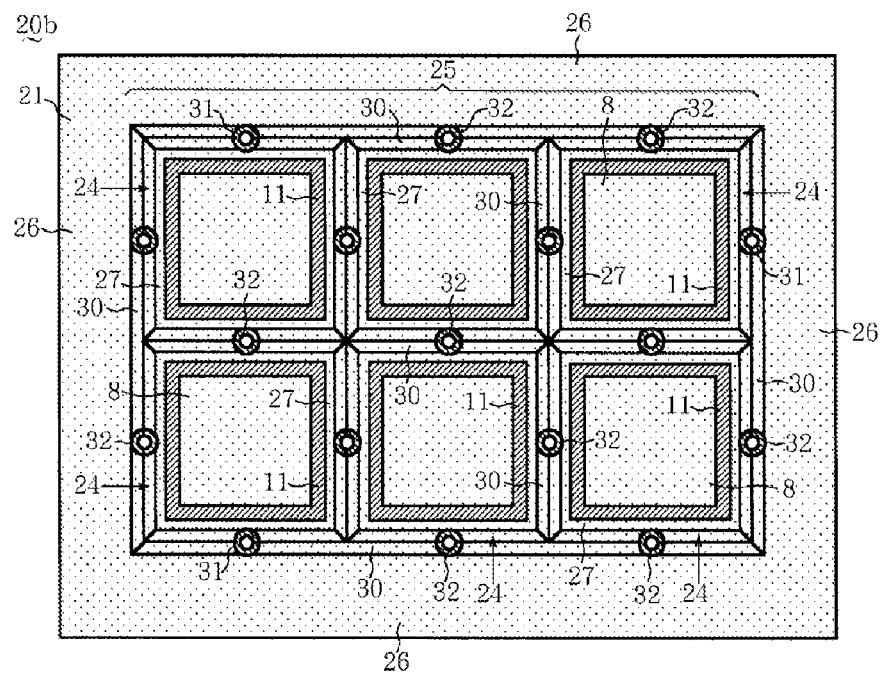
FIG. 10 is a plan view of a multi-piece wiring substrate array according to another embodiment of the present invention.

FIG. 10 is a plan view of a multi-piece wiring substrate array 20b according to another embodiment of the present invention.

As shown in FIG. 10, the multi-piece wiring substrate array 20b includes a product region 25, an edge portion 26, and dividing grooves 30 similar to those described above. In addition, each of the four dividing grooves 30 which define (in plan view) a wiring substrate unit 24 has, at a middle position thereof, a through-hole 31 which has a circular cross section, which extends from the front surface 21 to the back surface 22, and which crosses with the dividing groove 30 in a radial direction of the through-hole 31, and a circular tubular conductor 32 formed on the inner wall of the through-hole 31.

Figure 11:
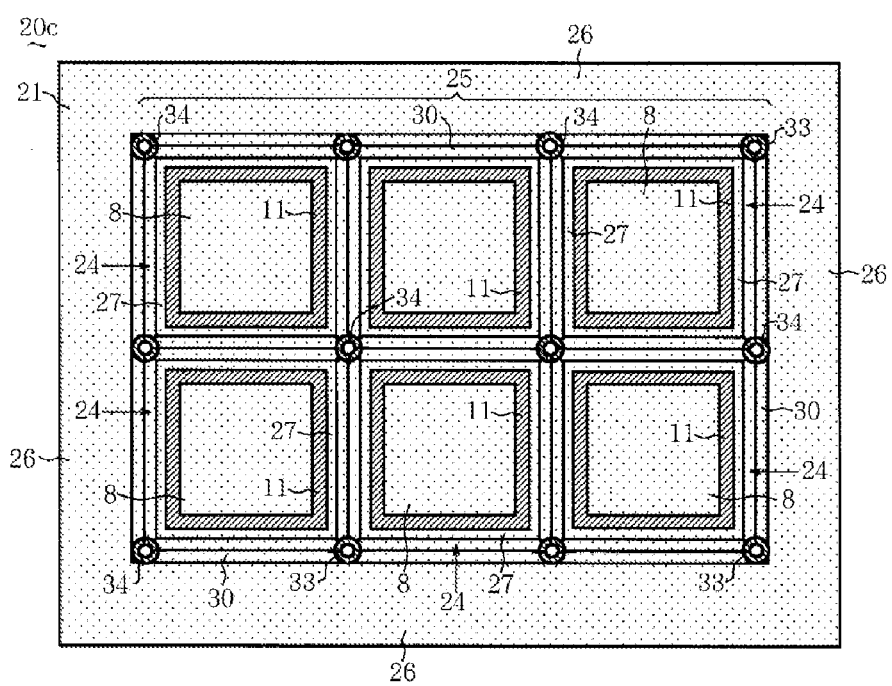
FIG. 11 is a plan view of a multi-piece wiring substrate array according to yet another embodiment of the present invention.

FIG. 11 is a plan view of a multi-piece wiring substrate array 20c according to yet another embodiment of the present invention.

As shown in FIG. 11, the multi-piece wiring substrate array 20c includes a product region 25, an edge portion 26, and dividing grooves 30 similar to those described above. In addition, each of the four dividing grooves 30 which define (in plan view) a wiring substrate unit 24 has, at the position where a pair of adjacent dividing grooves 30 cross orthogonally with each other, a through-hole 33 which has a circular cross section, which extends from the front surface 21 to the back surface 22, and which crosses with the dividing groove 30 in a radial direction of the through-hole 33, and a circular tubular conductor 34 formed on the inner wall of the through-hole 33. Each of the tubular conductors 32 and 34 is formed of, for example, W.

The aforementioned multi-piece wiring substrate array 20b or 20c exhibits effects similar to those obtained by the multi-piece wiring substrate array 20a. In addition, when the multi-piece wiring substrate array 20b or 20c is separated, along the dividing grooves 30, into a plurality of individual wiring substrates (1n), each of the wiring substrates has a notch 16 or 14 which is located at a middle portion (in a horizontal direction) of a side surface 5 or at the corner formed by a pair of adjacent side surfaces 5, and which is formed through division of the aforementioned through-hole 31 or 33 in an axial direction so as to extend from the front surface 3 of the wiring substrate to the back surface 4 thereof in a thickness direction; and a conductor layer 17 or 15 which is formed on the inner wall of the notch 16 or 14 through separation of the aforementioned tubular conductor 32 or 34 in an axial direction. In addition, accidental short circuit between the conductor layer 15 or 17 and the aforementioned metalized layer 11 can be prevented in the vicinity of a side surface 5 of each wiring substrate.

In the case of a multi-piece wiring substrate array having the notches 14 and 16 and the tubular conductors 15 and 17, when the multi-piece wiring substrate array is separated, along the dividing grooves 30, into individual pieces, a plurality of the aforementioned wiring substrates 1b can be produced. When a cavity 8, a metalized layer 11, and dividing grooves 30 are provided, in a manner similar to that described above, on the side toward the back surface 22 so as to be in line symmetry with respect to those provided on the side toward the front surface 21, there can be provided a multi-piece wiring substrate array for producing a plurality of the aforementioned wiring substrates 1d.

Next will be described a method for producing the multi-piece wiring substrate array 20a.

There were provided in advance a plurality of green sheets each having a specific thickness, and containing alumina powder and appropriate amounts of a resin binder, a solvent, etc. The green sheets were subjected to a plurality of punching processes, and an electrically conductive paste containing W powder or Mo powder was charged into the resultant through-holes having a relatively small diameter. The aforementioned electrically conductive paste was applied through printing to appropriate portions of the front surface and back surface of each of the green sheets, and then the green sheets were stacked and press-bonded together so that rectangular large through-holes communicated with one another.

Figure 12:
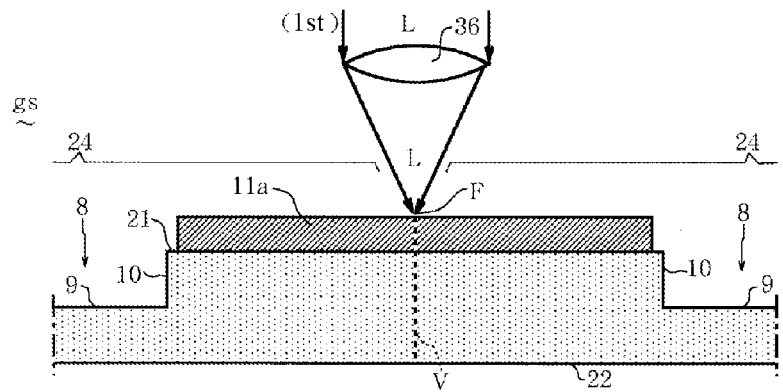
FIG. 12 schematically shows a dividing groove formation step of the multi-piece wiring substrate array production method.

Thus, as shown in FIG. 12, there was produced a green sheet laminate gs having a specific thickness, the green sheet laminate gs having a front surface 21 and a back surface 22; a plurality of wiring substrate units 24 adjacently arranged in a matrix form in plan view; a cavity 8 provided on each wiring substrate unit 24 so as to be open on the side toward the front surface 21; and an unfired metalized layer 11a formed on the front surface 21 above a dividing groove-forming position V between adjacent wiring substrate units 24, 24.

In the next step, the front surface 21 of the green sheet laminate gs was irradiated and scanned a plurality of times with a laser beam L so as to form a plurality of dividing grooves 30 partitioning the aforementioned wiring substrate units 24, a product region 25, and an edge portion 26, so that the grooves 30 were arranged in a lattice shape in plan view.

Specifically, as shown in FIG. 12, in the first (1st) irradiation process, while the metalized layer 11a formed on the front surface 21 of the green sheet laminate gs directly above the dividing groove-forming position V was irradiated with the laser beam L in a thickness direction, the laser beam L was continuously scanned in a longitudinal direction of the metalized layer 11a. In this process, the position of the focal point F of the laser beam L was set, by means of a focus-adjusting convex lens 36, to a position below the metalized layer 11a and on the side toward the back surface 22.

The laser beam L employed was, for example, a UV-YAG laser beam. The laser beam L was scanned at a constant scan rate (about 100 mm/second).

FIG. 12 schematically shows a cross section perpendicular to the scanning direction of the laser beam L. Each of FIGS. 13 to 15 also schematically shows the cross section.

In the case where a deep groove portion 28 of a dividing groove 30 was formed so as to have a depth of about 200 μm and an opening width of about 50 μm, irradiation of the laser beam L was carried out under the following conditions (frequency: about 30 to 100 Hz, repetition number: 2 to 5).

Figure 13:
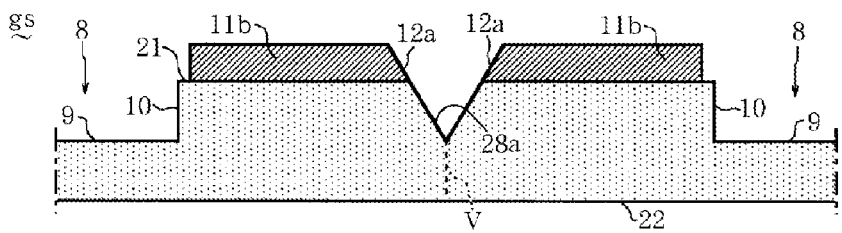
FIG. 13 schematically shows a dividing groove formation step subsequent to the step shown in FIG. 12.

Thus, as shown in FIG. 13, a deep groove portion 28a having an acute-angled cross section was formed along the dividing groove-forming position V so that the lowermost portion of the deep groove portion 28a was located in the interior of the green sheet laminate gs. In parallel therewith, the unfired metalized layer 11a was separated into a pair of adjacent metalized layers 11b by means of the deep groove portion 28a. Also, in the unfired metalized layers 11b, inclined surfaces 12a having a slope similar to that of the inner walls of the deep groove portion 28a were formed so as to be in line symmetry with each other.

Figure 14:
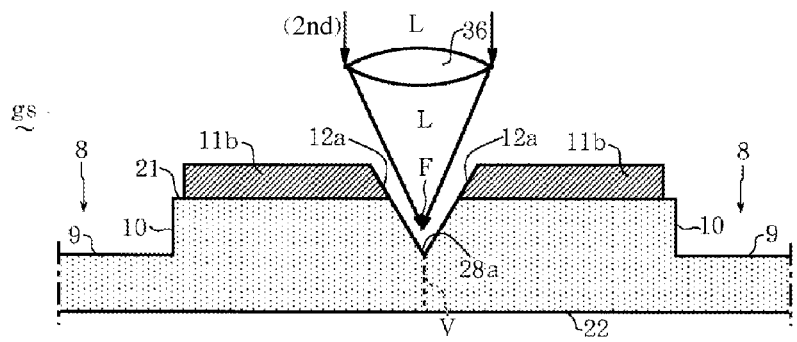
FIG. 14 schematically shows a dividing groove formation step subsequent to the step shown in FIG. 13.

Subsequently, as shown in FIG. 14, in the second (2nd) irradiation process, the laser beam L was continuously scanned along the deep groove portion 28a. In this process, the position of the focal point F of the laser beam L was set, by means of the focus-adjusting convex lens 36, to a position deeper (in a thickness direction of the green sheet laminate gs) than that in the first (1st) irradiation process. Since the thus-deepened position of the focal point F was offset from the metalized layers 11b, the energy of the laser beam L for processing was generally concentrated on the metalized layers 11b.

In the second irradiation process, the type of the laser beam L, the scan rate, and the laser irradiation conditions were the same as in the first irradiation process. In the second irradiation process, irradiation of the laser beam L may be carried out a plurality of times. Also, in the second or subsequent process, the position of the focal point F of the laser beam L for irradiation may be set to a position shallower (in a thickness direction of the green sheet laminate gs) than that in the first irradiation process.

Figure 15:
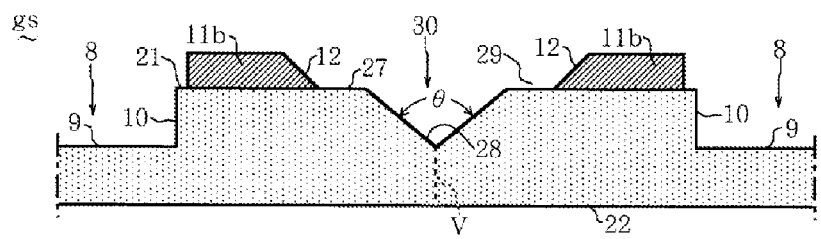
FIG. 15 schematically shows a portion of a green sheet in the vicinity of a dividing groove formed through the aforementioned steps.

Thus, as shown in FIG. 15, there were formed, on the side toward the front surface 21 of the green sheet laminate gs, the lattice-shaped dividing grooves 30 along the dividing groove-forming position V of the green sheet laminate gs, each dividing groove having the deep groove portion 28 having a cross-sectional obtuse angle θ, and a shallow groove portion 29 defined by the inclined surfaces 12 of a pair of the adjacent metalized layers 11b and by a pair of adjacent horizontal surfaces 27.

Subsequently, the green sheet laminate gs having the lattice-shaped dividing grooves 30 formed on the side toward the front surface 21 was fired at a specific temperature, and then the resultant ceramic laminate was subjected to Ni electroplating and Au electroplating by immersing the laminate in an Ni electroplating bath and an Au electroplating bath sequentially, to thereby form an Ni plating film and an Au plating film on, for example, the front surface of the fired metalized layer 11. Thus, the aforementioned multi-piece wiring substrate array 20a was produced.

According to the aforementioned production method for the multi-piece wiring substrate array 20a, there was reliably produced the multi-piece wiring substrate array 20a having a plurality of wiring substrates 1a, in which friction does not arise between the plating films m1 or m2 or brazing material layers bm covering the surfaces of the metalized layers 11 of the wiring substrates 1a, resulting in no damage to the plating films or the brazing material layers, or accidental fusion between adjacent brazing material layers bm does not occur. In addition, according to the production method, the dividing grooves 30 each having the deep groove portion 28 and the shallow groove portion 29 were reliably formed through the two-step laser beam L irradiation, which was carried out at different positions of the focal point F.

There may be provided a multi-piece wiring substrate array production method for producing a plurality of the aforementioned wiring substrates 1c, in which a cavity 8, a metalized layer 11, and dividing grooves 30 are formed, in a manner similar to that described above, on the side toward the back surface 22 so as to be in line symmetry with respect to those provided on the side toward the front surface 21.

Also, there may be provided a method for producing the aforementioned multi-piece wiring substrate array 20b or 20c, in which the through-holes 31 or 33 are formed along the thickness direction of the dividing groove-forming position V, and the tubular conductors 32 or 34 are formed in the inner walls of the through-holes 31 or 33, followed by the aforementioned two-step process of forming the dividing grooves 30 by means of the laser beam L. Alternatively, there may be provided a multi-piece wiring substrate array production method for producing a plurality of the aforementioned wiring substrates 1d.

The present invention is not limited to the above-described embodiments.

For example, the aforementioned wiring substrate or multi-piece wiring substrate array may be formed of a high-temperature fired ceramic material other than alumina (e.g., aluminum nitride or mullite).

The wiring substrate does not necessarily have the aforementioned cavity.

A plurality of cavities may be provided inside of the metalized layer of the wiring substrate.

In addition, the metalized layers formed on the front surface and back surface of the wiring substrate or the multi-piece wiring substrate array may be located at different positions in plan view. Accordingly, for example, horizontal surfaces on the side toward the front surface may have a width different from that of horizontal surfaces on the side toward the back surface.

INDUSTRIAL APPLICABILITY

According to the present invention, there can be provided a wiring substrate including a substrate main body and a metalized layer provided on the front surface of the substrate main body so as to extend along side surfaces thereof, in which a plating film and a brazing material layer formed on the front surface of the metalized layer are not damaged; a multi-piece wiring substrate array for simultaneously providing a plurality of the wiring substrates; and a method for reliably producing the multi-piece wiring substrate array.

DESCRIPTION OF REFERENCE NUMERALS 1a to 1d: wiring substrate
2, 2a: substrate main body
3: front surface of substrate main body
4: back surface of substrate main body
5: side surface
6: fracture surface
7: groove surface
11, 11a: metalized layer
13: horizontal surface of wiring substrate
14, 16: notch
15, 17: conductor layer
20a to 20c: multi-piece wiring substrate array
21: front surface of substrate main body/product region/edge portion
22: back surface of substrate main body/product region/edge portion
23: substrate main body
24: wiring substrate unit
25: product region
26: edge portion
27: horizontal surface of multi-piece wiring substrate array
28: deep groove portion
29: shallow groove portion
30: dividing groove
31, 33: through-hole
32, 34: tubular conductor
S: ceramic layer (ceramic laminate)
L: laser beam
F: focal point
gs: green sheet laminate
V: dividing groove-forming position

What is claimed is:

1. A wiring substrate comprising:
a substrate main body which is formed of a ceramic material and has a rectangular shape in plan view, and which has a front surface and a back surface and has four side surfaces, each being located between the front surface and the back surface, and having a groove surface located on a side toward the front surface and a fracture surface located on a side toward the back surface; and
a metalized layer which is formed on the front surface of the substrate main body so as to extend along the four side surfaces, and which has a rectangular frame shape in plan view,
wherein the metalized layer has an inclined surface located on an outer side toward the side surfaces of the substrate main body and forming an inclination angle with respect to the front surface of the substrate main body, the metalized layer also having a center-side surface on an inner side toward a center of the substrate main body in plan view and forming an angle of intersection with respect to the front surface of the substrate main body;
wherein the inclination angle of the inclined surface is smaller than the angle of intersection of the center-side surface; and
wherein the wiring substrate being characterized in that a horizontal surface where the ceramic material of the substrate main body is exposed is located between the metalized layer and the groove surface of each of the four side surfaces of the substrate main body.

2. A wiring substrate according to claim 1, wherein a groove surface similar to the front-surface-side groove surface is provided between the back surface of the substrate main body the fracture surface of each side surface; a metalized layer similar to that on the front surface is formed on the back surface of the substrate main body so as to extend along the four side surfaces; and another horizontal surface where the ceramic material of the substrate main body is provided between the metalized layer on the back surface and the back-surface-side groove of each side surface of the substrate main body.

3. A wiring substrate according to claim 1, wherein a notch is formed on a side surface of the substrate main body so as to extend from the front surface of the substrate main body to the back surface thereof in a thickness direction, the notch being open on the side toward the fracture surface of the side surface, and a conductor layer is formed on an inner wall of the notch such that at least one of the upper end and the lower end of the conductor layer does not extend to the horizontal surface.

4. A multi-piece wiring substrate array comprising:
a product region having a plurality of wiring substrate units which are adjacently arranged in a matrix form, each unit including a substrate main body which is formed of a ceramic material, and which has a front surface and a back surface and has a rectangular shape in plan view, and a rectangular-frame-shaped metalized layer provided on at least one of the front surface and the back surface of the substrate main body;
an edge portion which is formed of the ceramic material, which is located around the product region, and which has a front surface and a back surface and has a rectangular frame shape in plan view; and
dividing grooves which are formed on at least one of the front surface and the back surface of the wiring substrate array and are arranged in a lattice shape in plan view, and which are provided between adjacent wiring substrate units and between the product region and the edge portion, the multi-piece wiring substrate array being characterized in that each of the dividing grooves is formed of a deep groove portion provided between adjacent wiring substrate units, and a shallow groove portion defined by a pair of adjacent metalized layers formed on at least the front surfaces or the back surfaces of the adjacent wiring substrate units, and by a pair of adjacent horizontal surfaces of the adjacent ceramic substrate main bodies, each horizontal surface being exposed between the metalized layer and the deep groove portion;
wherein for each of the plurality of wiring substrate units the metalized layer provided on at least one of the front surface and the back surface of the substrate main body has an inclined surface located on an outer side toward the dividing grooves provided between the wiring substrate unit and adjacent wiring substrate units, the inclined surface forming an inclination angle with respect to the front surface or the back surface of the substrate main body onto which the metalized layer is provided, the metalized layer also having a center-side surface on an inner side toward a center of the substrate main body in plan view and forming an angle of intersection with respect to the front surface or the back surface of the substrate main body onto which the metalized layer is provided; and wherein the inclination angle of the inclined surface is smaller than the angle of intersection of the center-side surface.

5. A multi-piece wiring substrate array according to claim 4, wherein each of the dividing grooves has a through-hole which extends from the front surface to the back surface and which crosses with the dividing groove in a radial direction of the through-hole, and a tubular conductor formed on the inner wall of the through-hole.

* * * * *